United States Patent
Tucker

(10) Patent No.: US 10,454,272 B2
(45) Date of Patent: Oct. 22, 2019

(54) ELECTRONIC DEVICES AND METHOD FOR FILTERING COMMON MODE DISTURBANCES FROM POWER ELECTRONIC DEVICES

(71) Applicant: EPCOS AG, München (DE)

(72) Inventor: Andrew Tucker, Quarry Hill (AU)

(73) Assignee: EPCOS AG, München (DE)

( * ) Notice: Subject to any disclaimer, the term of this patent is extended or adjusted under 35 U.S.C. 154(b) by 144 days.

(21) Appl. No.: 15/573,470

(22) PCT Filed: Jun. 14, 2016

(86) PCT No.: PCT/EP2016/063630
§ 371 (c)(1),
(2) Date: Nov. 12, 2017

(87) PCT Pub. No.: WO2017/005464
PCT Pub. Date: Jan. 12, 2017

(65) Prior Publication Data
US 2018/0123344 A1   May 3, 2018

(30) Foreign Application Priority Data
Jul. 3, 2015 (EP) .................................... 15175302

(51) Int. Cl.
*H02J 3/01* (2006.01)
*H02M 1/12* (2006.01)
(Continued)

(52) U.S. Cl.
CPC ............... *H02J 3/01* (2013.01); *H02M 1/12* (2013.01); *H03H 7/0107* (2013.01);
(Continued)

(58) Field of Classification Search
None
See application file for complete search history.

(56) References Cited

U.S. PATENT DOCUMENTS

| | | |
|---|---|---|
| 4,434,396 A | 2/1984 | Montague |
| 5,378,937 A | 1/1995 | Heidemann et al. |

(Continued)

FOREIGN PATENT DOCUMENTS

| | | |
|---|---|---|
| EP | 1404013 A1 | 3/2004 |
| FR | 2675320 A1 | 10/1992 |

(Continued)

*Primary Examiner* — Cassandra F Cox
(74) *Attorney, Agent, or Firm* — Slater Matsil, LLP

(57) ABSTRACT

An electronic device and a method for filtering common mode disturbances from a power electronic device are disclosed. In an embodiment the device includes a first capacitor coupled in series to a first one-way conductor, the first one-way conductor allowing current flow in one direction, wherein the first one-way conductor and the first capacitor are coupled between a load node and a reference potential and a second capacitor coupled in series to a second one-way conductor, the second one-way conductor allowing current flow in an opposite direction, wherein the second one-way conductor and the second capacitor are coupled between the load node and the reference potential. The device further includes a third capacitor being coupled between the load node and the reference potential, a first switch bypassing the first one-way conductor and a second switch bypassing the second one-way conductor.

19 Claims, 8 Drawing Sheets

(51) Int. Cl.
  *H03H 7/01* (2006.01)
  *H03H 11/04* (2006.01)
  *H02H 9/00* (2006.01)
(52) U.S. Cl.
  CPC ......... *H03H 11/0405* (2013.01); *H02H 9/005* (2013.01); *H02M 2001/123* (2013.01)

(56) References Cited

U.S. PATENT DOCUMENTS

| | | |
|---|---|---|
| 5,684,688 A | 11/1997 | Rouaud et al. |
| 2001/0045863 A1* | 11/2001 | Pelly ................ H02M 1/12 327/552 |
| 2002/0105233 A1 | 8/2002 | Vice |

FOREIGN PATENT DOCUMENTS

| | | |
|---|---|---|
| JP | H05206895 A | 8/1993 |
| JP | 2003297934 A | 10/2003 |
| JP | 2010148231 A | 7/2010 |
| WO | 2017005464 A1 | 1/2017 |

\* cited by examiner

ELECTRONIC DEVICES AND METHOD FOR FILTERING COMMON MODE DISTURBANCES FROM POWER ELECTRONIC DEVICES

This patent application is a national phase filing under section 371 of PCT/EP2016/063630, filed Jun. 14, 2016, which claims the priority of European patent application 15175302.7, filed Jul. 3, 2015, each of which is incorporated herein by reference in its entirety.

TECHNICAL FIELD

The invention refers to a method for filtering common mode disturbances from power electronic devices that may serve as a line filter or as part thereof.

BACKGROUND

In an electrical installation it is usual to interpose a low-pass power line filter at the input of an electrical appliance to help prevent high frequency signals from passing between a load appliance and supply, thus improving the electromagnetic compatibility (EMC) of the system. A typical low-pass passive power line filter may comprise series inductive and shunt capacitive interconnected components.

Pulse width modulation (PWM) power electronic loads, such as variable speed motor drives, generate parasitic common mode currents. This is due to the high voltage slew rate of their switches imposed on the stray earth capacitance in the system. This common mode current constitutes an Electromagnetic Interference (EMI) which manifests itself as common mode (CM) conducted emissions and earth leakage current, phenomena in the field of Electromagnetic Compatibility (EMC).

The low pass power line filter provides a degree of common mode (CM) attenuation which effectively reduces the amplitude and bandwidth of common mode current allowed to flow on the supply line. However the size and cost of the filter can be prohibitively high especially when the common mode currents are high or when significant attenuation of such current is required at or near to the drive switching frequency.

SUMMARY OF THE INVENTION

Embodiments provide a method for filtering CM disturbances from switched power electronic systems having the benefit of reduced size and cost compared to a conventional passive filter.

A low pass power line filter may comprise or consist of one or more series inductive elements which have relatively low impedance at power frequencies which allows the relatively free conduction of power current and which have relatively high impedance at radio frequencies which restricts the flow of interference currents. In addition a low pass power line filter may comprise or consist of one or more shunt capacitive elements which have relatively high impedance at power frequencies which serves to isolate the power line voltages and which have relatively low impedance at radio frequencies which allows the flow of interference currents.

In its simplest form, an equivalent circuit of the common mode parameters of a low pass power line filter may comprise a series common mode inductance inserted between a line load and a load node and a shunt common mode capacitance inserted between the load node and the reference potential.

Various embodiments essentially replace the shunt common mode capacitance connected between the load node and the reference potential. The circuits of these embodiments provide for the reduction of load node voltage so that it remains close to the reference potential for as much time as possible. By doing so, the time integral of load node voltage is reduced. The load node voltage is essentially imposed over the series common mode inductance and the current made to flow in this inductance is proportional to the time integral of the load node voltage. Thus the circuit means described in this invention serve to reduce the current in the series common mode inductance.

Various embodiments of the invention provide electronic devices and corresponding methods that reduce the node load voltage by switches or by an amplifier, which are alternative means for achieving the same goal.

In one embodiment, an electronic device comprises a first capacitive element being coupled in series to a first one-way conductor that allows current flow in one direction. The first one-way conductor and the first capacitive element are coupled between a load node and a reference potential. The current flow may be allowed in the direction from the load node to the reference potential, which may be defined as one direction.

A second capacitive element is coupled in series to a further one-way conductor that allows current flow in the opposite direction. The further one-way conductor and the second capacitive element are coupled between the load node and the reference potential. The current flow may be allowed in the direction from the reference potential to the load node, which may be defined as the opposite direction. The one-way conductor may be diodes.

A capacitive means is coupled between the load node and the reference potential. The capacitive means may comprise one or more capacitors. A first switch connects between a potential node that is between the first one-way conductor and the first capacitive element, and the load node. A second switch connects between a further potential node, which is between the further one-way conductor and the second capacitive element, and the load node. The switches may be switched by means of a switch control, for example, between a conducting state allowing current flow and a non-conducting state with no current flow.

The one-way conductors, which may be diodes, are connected to the load node and the capacitive elements are connected to the reference node. Alternatively the complete circuit arrangement can be inverted in relation to load and reference nodes.

The method for filtering common mode disturbances by such an electronic device comprises applying alternating positive and negative voltage transitions at the load node, charging the first capacitive element and the capacitive means positive by one positive voltage transition of the load node, transferring energy to the first capacitive element and the capacitive means, discharging the capacitive means and the second capacitive element, the latter having been charged negative by a previous negative voltage transition at the load node, when the second switch is switched to the conducting state, then switching it to the non-conducting state, charging the second capacitive element and the capacitive means negative by one negative voltage transition of the load node, transferring energy to the second capacitive element and the capacitive means, and discharging the capacitive means and the first capacitive element, the latter having been charged positive by a previous positive voltage transition at the load node, when the first switch is switched to the conducting state, then switching it to the non-conducting state.

In one embodiment, the electronic device comprises a first capacitor being coupled in series to a first one-way conductor, the first one-way conductor and the first capacitor being coupled between the load node and the reference potential, and a second capacitor being coupled in series to a second one-way conductor, the second one-way conductor and the second capacitor being coupled between the load node and the reference potential, and a third capacitor being coupled in series to a third one-way conductor, the third one-way conductor and the third capacitor being coupled between the load node and the reference potential, and a fourth capacitor being coupled in series to a fourth one-way conductor, the fourth one-way conductor and the fourth capacitor being coupled between the load node and the reference potential. The first and third one-way conductors allow current flow in one direction; the second and fourth one-way conductors allow current flow in the opposite direction. The first switch connects between a first potential node, which is between the first capacitor and the first one-way conductor, and a second potential node, that is between the second capacitor and the second one-way conductor. The second switch connects between a third potential node, which is between the third capacitor and the third one-way conductor, and a fourth potential node, that is between the fourth capacitor and the fourth one-way conductor.

Preferably, the one-way conductors, which may be diodes, are connected to the load node and the capacitive elements are connected to the reference node. Alternatively the load and reference node connections may be reversed. The switches may be switched by means of a switch control, for example, between a conducting state allowing current flow and a non-conducting state with no current flow.

A method for filtering common mode disturbances by an electronic device as mentioned above comprises applying alternating positive and negative voltage transitions at the load node, charging the first capacitor and the third capacitor positive by one positive voltage transition of the load node, where the first one-way conductor and the third one-way conductors are in the conduction state, transferring energy to the first capacitor and the third capacitor, discharging the first capacitor and the second capacitor, the latter having been charged negative by a previous negative voltage transition at the load node, when the first switch is switched to the conducting state, switching the first switch to the non-conducting state, charging the second capacitor and the fourth capacitor negative by one negative voltage transition of the load node, where the second one-way conductor and the fourth one-way conductors are in the conduction state, transferring energy to the second capacitor and the fourth capacitor, discharging the third capacitor and the fourth capacitor, the former having been charged positive by the previous positive voltage transition at the load node, when the second switch is switched to the conducting state, and switching the second switch to the non-conducting state.

In one embodiment, the electronic device comprises a first capacitor being coupled in series to the first one-way conductor, the first capacitor and the first one-way conductor being coupled between the load node and the reference potential, and a second capacitor being coupled in series to the second one-way conductor, the second capacitor and the second one-way conductor being coupled between the load node and the reference potential, and a third capacitor being coupled between the load node and the reference potential. A first switch is connected in parallel with the first one-way conductor and a second switch is connected in parallel with the second one-way conductor. Preferably, the one-way conductors, which may be diodes, are connected to the load node and the capacitive elements are connected to the reference node. Alternatively the load and reference node connections may be reversed. The switches may be switched by means of a switch control, for example, between a conducting state allowing current flow and a non-conducting state with no current flow.

The method for filtering common mode disturbances by such an electronic device comprises applying alternating positive and negative voltage transitions at the load node charging the first capacitor and the third capacitor positive by one positive voltage transition of the load node, where the first one-way conductor is in the conduction state, transferring energy to the first capacitor and the third capacitor, discharging the second capacitor and the third capacitor, the former having been charged negative by a previous negative voltage transition at the load node, when the second switch is switched to the conducting state switching the second switch to the non-conducting state, charging the second capacitor and the third capacitor negative by one negative voltage transition of the load node, where the second one-way conductor is in the conduction state, transferring energy to the second capacitor and the third capacitor, discharging the first capacitor and third capacitor, the former having been charged positive by a previous positive voltage transition at the load node, when the first switch is switched to the conducting state, and switching the first switch to the non-conducting state.

The first switch connected in parallel with the first one-way conductor or the second switch connected in parallel with the second one-way conductor may be embodied as a MOSFET with body diode or an insulated-gate bipolar transistor with a freewheeling diode or a bipolar junction transistor with a freewheeling diode or a silicon-controlled rectifier (SCR) with a reverse connected diode in parallel.

In one embodiment, a method concerns a device wherein a first capacitor is connected in series with a first one-way conductor, a second capacitor is connected in series with a second one-way conductor, a third capacitor is connected in series with a third one-way conductor, and a fourth capacitor is connected in series with a forth one-way conductor. These series connections are all connected in parallel between the load node and the reference potential. The one-way conductors are polarized such that the first and third capacitors charge positive and the second and fourth capacitors charge negative in relation to the reference potential, as a result of positive and negative voltage excursions of the load node respectively. A first switch bridges between the first and second capacitors and a second switch bridges between the third and fourth capacitors.

The method further comprises charging the first and third capacitors positively by a positive voltage transition at the load node, while the first switch is in the non-conducting state, discharging the first and second capacitors, the latter having been charged negatively by a previous negative voltage transition of the load node, when the first switch is switched to the conducting state, switching the first switch to the non-conducting state, charging the second and fourth capacitors negatively by a negative voltage transition at the load node, while the second switch is in the non-conducting state, discharging the third and fourth capacitors, the former having been charged positively by a previous positive voltage transition of the load node, when the second switch is switched to the conducting state, and switching the second switch to the non-conducting state. In the above-mentioned method, the second and third capacitors serve as charge reservoirs that allow discharging the first and fourth capacitors.

An alternating impulsive current generated by a load (i.e., a variable speed motor drive) is rectified into the array of four equal valued capacitors. Two capacitors can be charged positively and two negatively. Immediately after each impulsive event, the energy in one capacitor is discharged, via a suitable switch, with the energy in another capacitor of opposite polarity. The energy in one capacitor is always stored and held until the subsequent impulse event so that energy of opposite polarity is available for the next discharge. In this way the energy and associated voltage at the load node is reduced near to the reference potential during most of the time and consequently the common mode current generated in the filter common mode inductor, which is proportional to the time integral of load node voltage, is reduced considerably.

In another embodiment, a first capacitor connects in series to the drain of a first MOSFET and a second capacitor connects in series to the source of a second MOSFET. These series legs are further connected in parallel between the load node and the reference potential, where the source of the first MOSFET and the drain of the second MOSFET connect to the load node and the first and second capacitors connect to the reference potential. A third capacitor connects between the load node and the reference potential. The MOSFETs may be both n-channel type with integrated body diodes.

The method further comprises charging the first and third capacitors positively by a positive voltage transition at the load node, while the first and second MOSFETs are in the non-conducting state and the body diode of the first MOSFET is forward biased, discharging the second and third capacitors, the former having been charged negatively by a previous negative voltage transition of the load node, when the second MOSFET is switched to the conducting state, switching the second MOSFET to the non-conducting state, charging the second and third capacitors negatively by a negative voltage transition at the load node, while the first and second MOSFETs are in the non-conducting state and the body diode of the second MOSFET is forward biased, discharging the first and third capacitors, the former having been charged positively by a previous positive voltage transition of the load node, when the first MOSFET is switched to the conducting state; and switching the first MOSFET to the non-conducting state.

In the above-mentioned method, the first and second capacitors serve as charge reservoirs that allow discharging the third capacitor. The first and second capacitors may be chosen to be larger than the third capacitor wherein the third capacitor may be fully discharged or discharged beyond the reference potential while the first and second capacitors may be only partially discharged.

An alternating impulsive current generated by a load (i.e., a variable speed motor drive) is rectified into the array of three capacitors. One capacitor is charged positively, a second capacitor is charged negatively and a third capacitor is charged both positively and negatively as a result of positive and negative voltage transitions of the load node. Immediately after each impulsive event, the energy in the bipolar capacitor is discharged, via a suitable switch, with the energy, or part thereof, in the polarized capacitor of opposite polarity. The energy in one polarized capacitor is always stored and held until the subsequent impulse event so that energy of opposite polarity is available for the next discharge. In this way the energy and associated voltage at the load node is reduced near to the reference potential during most of the time and consequently the common mode current generated in the filter common mode inductor, which is proportional to the time integral of load node voltage, is reduced considerably.

In one embodiment, the electronic device comprises a first capacitor being coupled in series to a first one-way conductor that allows current flow in one direction, the first one-way conductor and the first capacitor being coupled between a load node and a reference potential. A second capacitor is coupled in series to a second one-way conductor that allows current flow in the opposite direction, the second one-way conductor and the second capacitor being coupled between the load node and the reference potential. A third capacitor is coupled between the load node and the reference potential. The device comprises an amplifier having an output terminal, and positive and negative supply rail terminals. The output terminal is coupled to the load node. The positive supply rail terminal is coupled to a first potential node that is between the first capacitor and the first one-way conductor. The negative supply rail terminal is coupled to the second potential node, which is between the second capacitor and the second one-way conductor.

The one-way conductors which may be diodes are connected to the load note and the capacitive elements are connected to the reference note. "Coupling" two components includes a direct connection between the components and coupling further components between the two components. Preferably, further components are coupled between the output terminal and the load node.

The method for filtering common mode disturbances by such an electronic device comprises applying positive and negative voltage transitions at the load node, charging the first capacitor positive by positive voltage transitions of the load node, where the first one-way conductor in conduction state, transferring energy to the first capacitor, charging the second capacitor negative by negative voltage transitions of the load node, where the second one-way conductor in conduction state, transferring energy to the second capacitor, charging the third capacitor positive when a positive transition is applied and negative when a negative transition is applied, discharging the third capacitor to a voltage near to reference potential into the output terminal of the amplifier, at least partially discharging the first capacitor via the positive supply rail terminal of the voltage buffer amplifier, and at least partially discharging the second capacitor via the negative supply rail terminal of the voltage buffer amplifier.

In yet another embodiment, a bypass inductor and discharge resistor are connected in parallel and which are further connected in series with, and on the load-side of, the common mode inductance. A voltage buffer amplifier having an input terminal connected via a capacitance to the reference potential, an output terminal connected to the series junction of the common mode inductance and the bypass inductor, a positive supply terminal which is connected via a first diode to the load node and a negative supply terminal which is connected via a second diode to the load node. The diodes are orientated such that the positive supply terminal is charged positively and the negative supply terminal is charged negatively as a result of positive and negative voltage excursions of the load node respectively. A first capacitor is connected between the positive supply terminal and the reference potential and a second capacitor is connected between the negative supply terminal and the reference potential. A third capacitor connects between the load node and the reference potential.

The method further comprises charging the first and third capacitors positively by a positive voltage transition at the load node, while the first diode is forward biased, discharging the second and third capacitors, the former having been charged negatively by a previous negative voltage transition of the load node, via the discharge resistor, the output terminal and the negative supply terminal, charging the second and third capacitors negatively by a negative voltage transition at the load node, while the second diode is forward biased, and discharging the first and third capacitors, the former having been charged positively by a previous positive voltage transition of the load node, via the discharge resistor, the output terminal and the positive supply terminal.

In the above-mentioned method, the first and second capacitors serve as charge reservoirs that allow discharging the third capacitor. The voltage buffer amplifier serves to keep the load side of the common mode inductor near to the reference potential.

An alternating impulsive current generated by a load (i.e., a variable speed motor drive) is passed into the array of three capacitors. A first capacitor is charged positively, a second capacitor is charged negatively and a third follows the load node potential. The third capacitor is discharged continuously via a discharge resistor and a voltage buffer amplifier which serves to distribute the discharge current via its supply terminals to the polarized capacitors. The discharge current amplitude is controlled by the value of the discharge resistor. At motor drive carrier frequencies the output terminal voltage, which is connected to the load-side of the common mode inductor, is held close to the reference potential. In this way the energy and associated voltage at the load-side of the common mode inductor is reduced near to the reference potential during most of the time and consequently the common mode current generated in the common mode inductor, which is proportional to the time integral of the voltage imposed on it, is reduced considerably.

In one embodiment, a method for filtering common mode disturbances concerns an electronic device comprising a first capacitor being coupled in series to a first one-way conductor, the first capacitor and the first one-way conductor being coupled between a load node and a reference potential, a second capacitor being coupled in series to a second one-way conductor, the second capacitor and the second one-way conductor being coupled between the load node and the reference potential, a third capacitor being coupled between load node and the reference potential, a first inductor being coupled in series to second inductor, the first inductor and the second inductor being coupled between the line node and the load node with first inductor on the line-side and second inductor (L2) on the load-side, a resistor being coupled in parallel with the second inductor, and a voltage buffer amplifier with its output terminal being coupled to the series junction between the first inductor and the second inductor, its positive supply rail terminal being coupled to the first capacitor and its negative supply rail terminal being coupled to the second capacitor and its input terminal coupled at drive carrier frequencies via a fourth capacitor which is connected to the reference potential.

Positive and negative voltage transitions are present at the load node.

The method comprises charging the first capacitor positive by positive voltage transitions of the load node, where the first one-way conductor in conduction state, transferring energy to the first capacitor, charging the second capacitor negative by negative voltage transitions of the load node, where the second one-way conductor in conduction state, transferring energy to the second capacitor, charging the third capacitor to the load node potential, varying over time sometimes positive and sometimes negative, discharging the third capacitor via the resistor to a voltage near to reference potential into the output terminal of the voltage buffer amplifier, partially discharging the first capacitor via the positive supply rail terminal of the voltage buffer amplifier, partially discharging the second capacitor via the negative supply rail terminal of the voltage buffer amplifier, and holding the series junction of the first inductor and the second inductor by the output terminal of the voltage buffer amplifier, where the input terminal of the voltage buffer amplifier is referenced at drive carrier frequencies to the reference potential by a fourth capacitor.

The parallel resistor, which serves to dissipate energy and control discharge current, can be replaced with a voltage boost device, wherein the input to the voltage boost device is coupled to the second inductor via an auxiliary winding, the output of the voltage boost device is coupled to an external power sink, such as the dc link of the variable speed motor drive, where the removed energy can be used efficiently.

A linear voltage amplifier may be connected in closed loop to provide the same function as the voltage buffer amplifier. The linear voltage amplifier can be replaced with a D Class voltage amplifier to improve efficiency of the amplifier.

The capacitor connected to the input terminal of the voltage buffer amplifier is replaced by a high pass filter to improve the rejection of power frequency common mode voltages.

Several interface networks of capacitors and resistors are included to provide effective filtering of 3 phase supply. A star network of capacitors and series resistor can couple the 3 phases to the output terminal of the linear voltage amplifier. A star network of capacitors can couple the three phase load node to the one-way conductors and the third capacitor. A star network of high impedance components such as resistors can couple the 3 phases to the inverting input terminal of the linear voltage amplifier.

BRIEF DESCRIPTION OF THE DRAWINGS

Features that are described herein above and below in conjunction with the different aspects and embodiments presented may also apply to other aspects and embodiments. Further features and advantageous embodiments of the subject-matter of the disclosure will become apparent from the following description of the exemplary embodiments in conjunction with the figures, in which.

DETAILED DESCRIPTION OF ILLUSTRATIVE EMBODIMENTS

Figure 1:
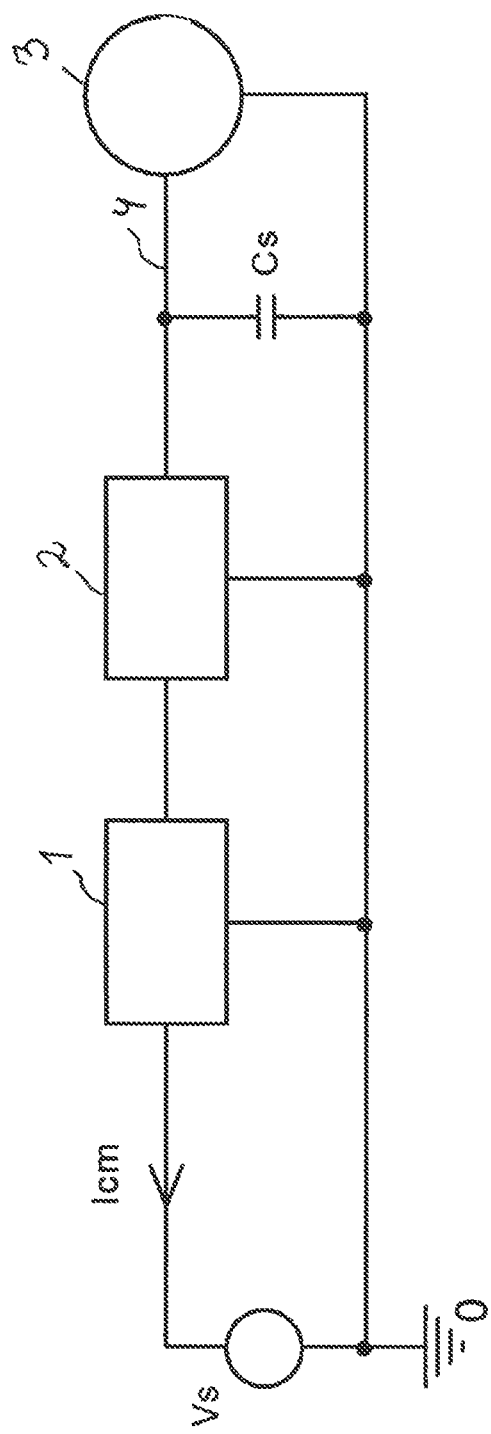
FIG. 1 shows a common mode equivalent circuit of a variable speed drive system.

FIG. 1 shows a single line common mode equivalent circuit of a variable speed motor drive system connected to a TN supply where the supply is connected to the reference potential, in this case the supply earth. Voltage Vs represents a common mode voltage which results from a voltage imbalance relative to the reference potential. On balanced three phase supply Vs may be quite small while for single phase or corner earthed three phase supplies it may be larger. The supply is connected via a low pass power line filter 1 to a variable speed motor drive 2 and then to a screened motor cable 4 and to a motor 3. The system may contain one or more motor drives 2 and one or more motors 3. The motor drive 2 may be regenerative or non-regenerative type.

All parts of the power train may effect capacitive coupling to the reference potential, which may be stray (parasitic) or intentional. The screened motor cable may form a large stray capacitive component especially where the motor cable is long. This capacitance is represented collectively by Cs. The high slew rate voltage transitions from the switches in the variable speed motor drive 2 cause impulsive common mode current to flow in loops along the power conductors and earth connections.

The low pass power line filter works to contain these impulsive common mode currents to its load-side and to limit the amplitude and frequency bandwidth of common mode interference current Icm allowed to flow in the supply line.

Figure 2:
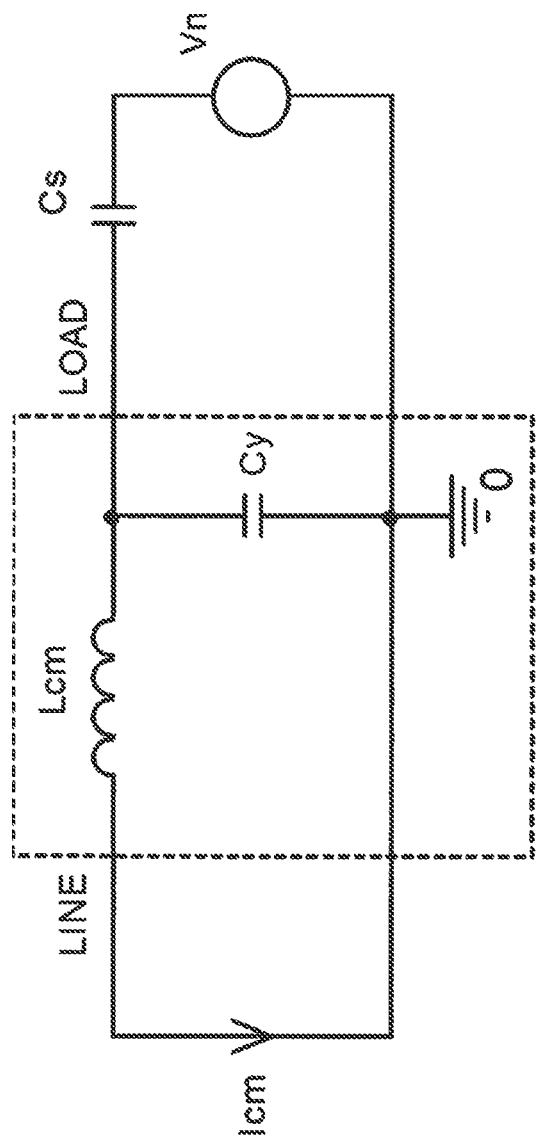
FIG. 2 shows a common mode equivalent circuit of a low pass power line filter and terminating networks.

The common mode equivalent circuit of a low pass line filter and terminating networks is shown in FIG. 2. A common mode inductance Lcm is connected between the line node LINE and the load node LOAD. A common mode capacitance Cy is connected between the load node LOAD and the reference potential 0. Lcm and Cy represent the common mode parameters of the low pass power line filter. The power line filter is terminated on the line-side by a short circuit to the reference potential where a common mode interference current Icm may flow. For simplicity common mode power line voltage Vs, from FIG. 1, is assumed to be zero. The power line filter is terminated on the load-side with the reference coupled capacitance Cs connected in series with a voltage source Vn which represents the switching transitions of the variable speed motor drive switches. Impulsive currents resulting from the switch transitions in the load impinge on the load-side of the filter. The series inductance and shunt capacitance are selected to give relative impedances such that the impulsive current passes mainly through the common mode capacitance Cy. The current allowed to flow in the common mode inductor Lcm, and therefore the current Icm allowed to flow on the supply line, is proportional to the time integral of the resultant voltage across the common mode capacitance Cy.

Significant problems can result in the filter when the common mode inductance and common mode capacitance self-resonate wherein the common mode current in the inductor and therefore the current on the supply line Icm, may become very large. This may result in high system losses and may result in magnetic saturation of the common mode inductor Lcm core.

Figure 3:
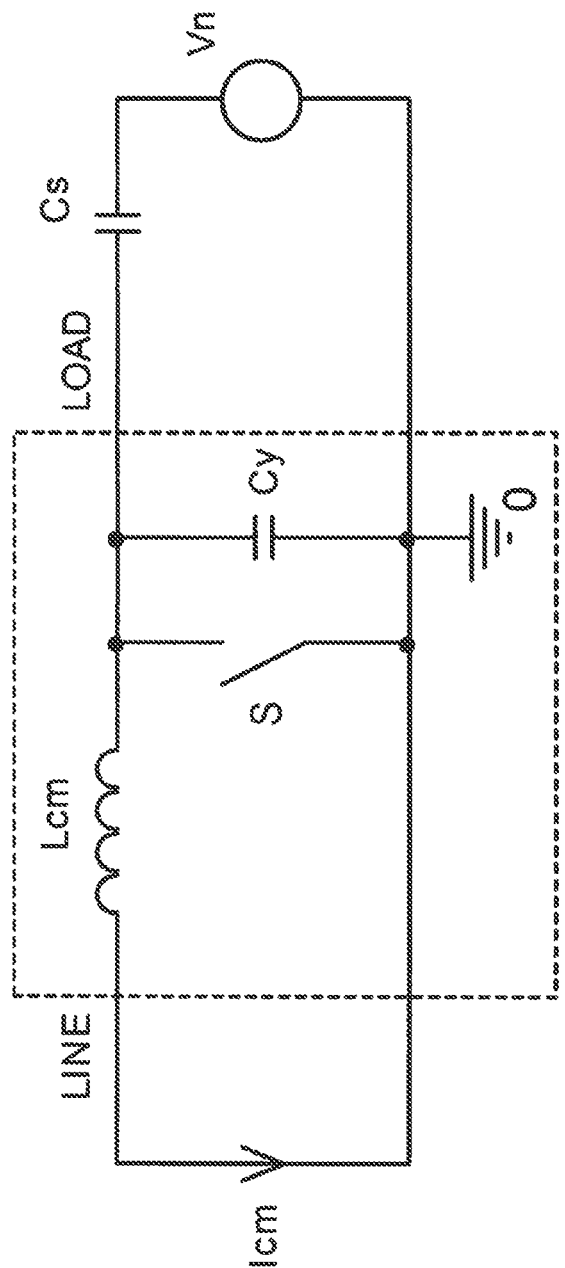
FIG. 3 shows a common mode equivalent circuit of a low pass power line filter, including a switch over the capacitor, which is for demonstration purposes only.

FIG. 3 shows one principle of operation of the invention where a switch S is imposed in parallel with the common mode capacitor Cy.

The switch S, which is normally open, may be closed momentarily immediately after the common mode capacitor Cy has been charged by a voltage transition of the load node LOAD. When the common mode capacitor Cy is discharged and its energy mostly dissipated, there is little energy available to energize the common mode inductance Lcm. The current in the common mode inductor Lcm, which is proportional to the time integral of the voltage over the common mode capacitance Cy, is reduced when the voltage across the common mode capacitance Cy is held near to the reference potential for as much time as possible.

The imposition of the switch S in parallel with the common mode capacitor Cy is for demonstration purposes only. Such a configuration cannot be used in a power line filter because the switch S will compromise the voltage isolation provided by the common mode capacitor Cy between the power line voltages and the reference potential.

The dissipation of energy from the common mode capacitance Cy by switch S serves to avoid self-resonate between the common mode inductance Lcm and the common mode capacitance Cy.

Figure 4:
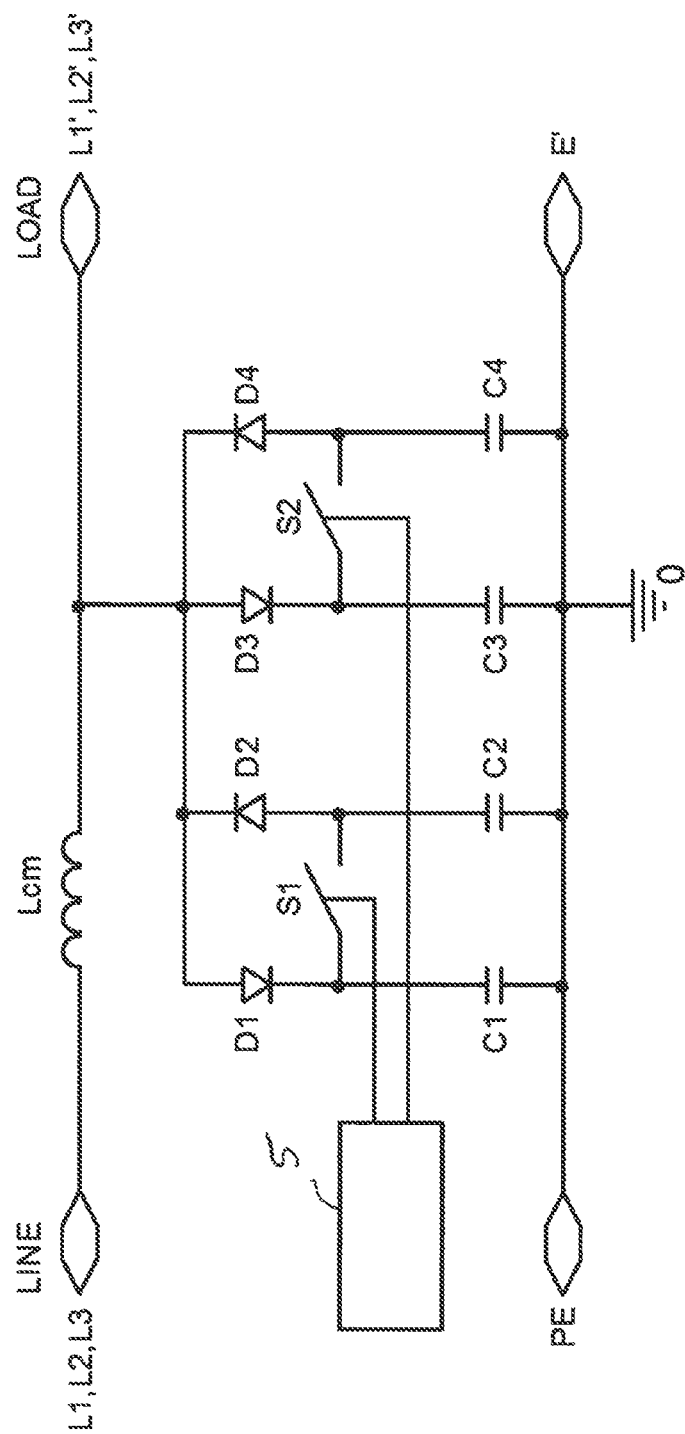
FIG. 4 shows a common mode equivalent circuit of one embodiment of the invention involving four capacitors, four diodes and two switches.

FIG. 4 shows an embodiment of the invention where the common mode capacitance Cy of FIG. 2 is replaced by a network of four capacitors C1, C2, C3 and C4, four diodes D1, D2, D3 and D4 and two switches S1 and S2. The diodes work as rectifiers such that capacitors C1 and C3 charge positive and capacitors C2 and C4 are charge negative in relation to the reference potential 0. Switch S1 bridges between capacitors C1 and C2 and switch S2 bridges between capacitors C1 and C4. The switches S1 and S2 are controlled by a control circuit 5 serving as switch control.

The circuit works as follows: Switches S1 and S2 are normally in the non-conducting state. Capacitors C1 and C3 are charged positive due to a positive impulsive current entering the load node. Immediately after this event switch S1 is momentarily closed, whereby the charge in C1 is discharged with the charge in C2 which has been charged negative by a previous negative impulsive current entering the load node. Capacitors C2 and C4 are charged negative due to a negative impulsive current entering the load node. Immediately after this event switch S2 is momentarily closed, whereby the charge in C4 is discharged with the charge in C3 which has been charged positive by a previous positive impulsive current entering the load node.

An alternating impulsive common mode current impinging on the load node is allowed to charge a capacitor pair, immediately after which the one of these capacitors is discharged with one of the capacitors which was previously charged to the opposite polarity.

The voltage isolation integrity provided by capacitors C1, C2, C3 and C4 is maintained because the switches S1 and S2 are connected between the capacitors and are not connected to the reference potential.

The voltage at the load node is reduced near to the reference potential during most of the time and consequently the common mode current generated in the filter common mode inductor, which is proportional to the time integral of load node voltage, is reduced considerably.

In the above-mentioned method, capacitors C2 and C3 serve as charge reservoirs that allow the discharging of capacitors C1 and C4.

Figure 5:
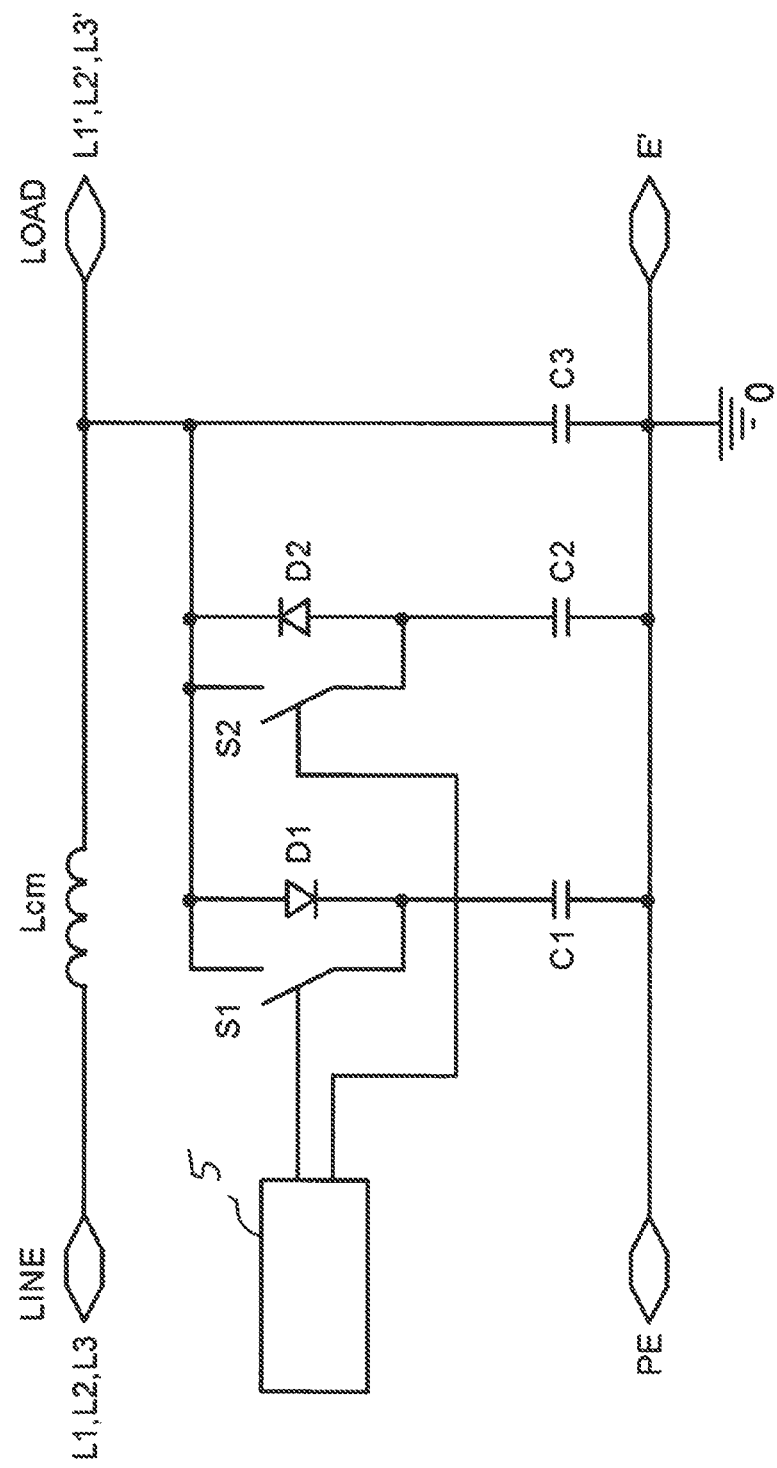
FIG. 5 shows a common mode equivalent circuit of one embodiment of the invention involving three capacitors and two diodes and two switches.

FIG. 5 shows an embodiment of the invention where the common mode capacitance Cy of FIG. 2 is replaced by a network of three capacitors C1, C2 and C3, two diodes D1 and D2 and two switches S1 and S2. The diodes work as rectifiers such that capacitor C1 charges positive and capacitor C2 charges negative in relation to the reference potential 0. Switch S1 connects in parallel with diode D1 and switch S2 connects in parallel with between diode D2. When the switches are closed the diodes are bypassed. Capacitor C3 follows the load node voltage. The switches S1 and S2 are controlled by a control circuit 5 serving as switch control.

The circuit works as follows: Switches S1 and S2 are normally in the non-conducting state. Capacitors C1 and C3 are charged positive due to a positive impulsive current entering the load node. Immediately after this event switch S2 is momentarily closed, whereby the charge in C3 is discharged with the charge in C2 which has been charged negative by a previous negative impulsive current entering the load node. Capacitors C2 and C3 are charged negative due to a negative impulsive current entering the load node. Immediately after this event switch S1 is momentarily closed, whereby the charge in C3 is discharged with the charge in C1 which has been charged positive by a previous positive impulsive current entering the load node.

An alternating impulsive common mode current impinging on the load node is allowed to charge a capacitor pair, immediately after which the capacitor C3 is discharged with the capacitor C1 or C2 which was previously charged to the opposite polarity.

The voltage isolation integrity provided by capacitors C1, C2 and C3 is maintained because the switches S1 and S2 are connected across the diodes and are not connected to the reference potential.

The voltage at the load node is reduced near to the reference potential during most of the time and consequently the common mode current generated in the filter common mode inductor, which is proportional to the time integral of load node voltage, is reduced considerably.

In the above-mentioned method, capacitors C1 and C2 serve as charge reservoirs that allow discharging capacitor C3. Capacitors C1 and C2 may be chosen to be larger than capacitor C3 wherein the capacitor C3 may be fully discharged or discharged beyond the reference potential while capacitors C1 and C2 may be only partially discharged.

Figure 6:
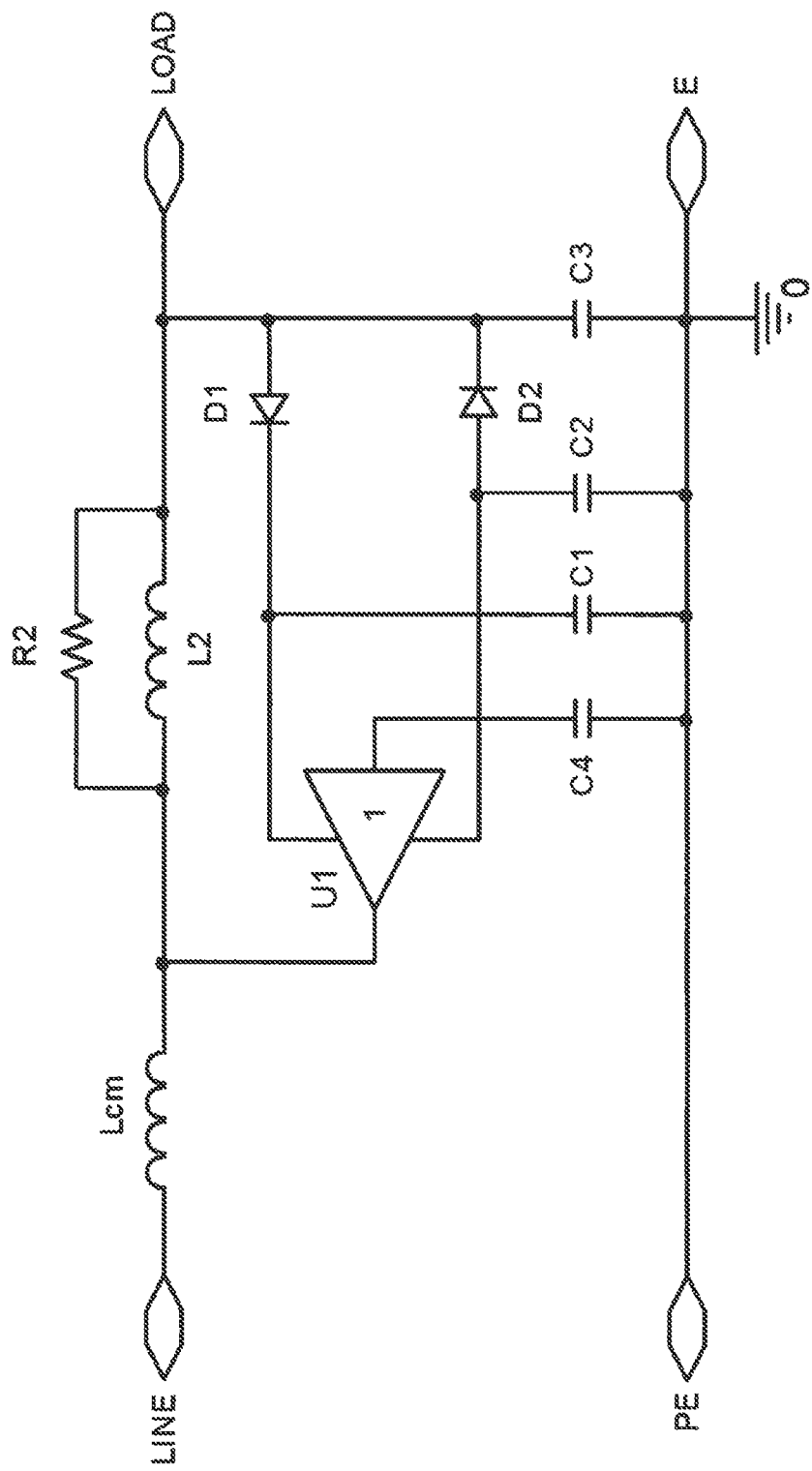
FIG. 6 shows a common mode equivalent circuit of one embodiment of the invention involving three capacitors, two diodes, a voltage buffer amplifier, a bypass inductor and a discharge resistor.

FIG. 6 shows an embodiment of the invention where the common mode capacitance Cy of FIG. 2 is replaced by a network of four capacitors C1, C2, C3 and C4, two diodes D1 and D2, a voltage buffer amplifier U1, a bypass inductor L2 and a discharge resistor R2. The diodes work as rectifiers such that capacitor C1 charges positive and capacitor C2 charges negative in relation to the reference potential 0. The input of the voltage buffer amplifier is reference to the reference potential via capacitor C4. The buffer amplifier output voltage, which follows the reference potential at radio frequencies, is connected to the line-side of bypass inductor L2.

The circuit works as follows: Capacitors C1 is charged positive due to positive impulsive current entering the load node and capacitor C2 is charged negative due negative impulsive current entering the load node. Capacitor C3 follows the load node voltage. The output terminal of U1 is constantly maintained at the reference potential such that capacitor C3 is constantly discharged via discharge resistor R2 which controls the amplitude of discharge current. The aim is to maintain the voltage across capacitor C3 as near to the reference potential for as much time as possible. The discharge current taken form capacitor C3 is fed via the supply terminals of U1 to capacitors C1 and C2 which are partially discharged.

An alternating impulsive common mode current impinging on the load node is allowed to charge a capacitor pair, immediately after which the capacitor C3 is discharged with the capacitor C1 or C2 which was previously charged to the opposite polarity. Voltage isolation integrity is provided by capacitors C1, C2, C3 and C4.

The voltage on the load-side of the common mode inductor Lcm is reduced near to the reference potential during most of the time and consequently the common mode current generated in the filter common mode inductor Lcm, which is proportional to the time integral of the voltage across the common mode inductor Lcm, is reduced considerably.

In the above-mentioned method, capacitors C1 and C2 serve as charge reservoirs that allow discharging capacitor C3. Capacitors C1 and C2 also serve as power supply reservoir capacitors feeding voltage buffer amplifier U1. Capacitors C1 and C2 may be chosen to be larger than capacitor C3 wherein the capacitor C3 may be fully discharged while capacitors C1 and C2 may be only partially discharged. The output of the voltage buffer amplifier serves to maintain near reference potential on the load-side of common mode inductor Lcm.

Figure 7:
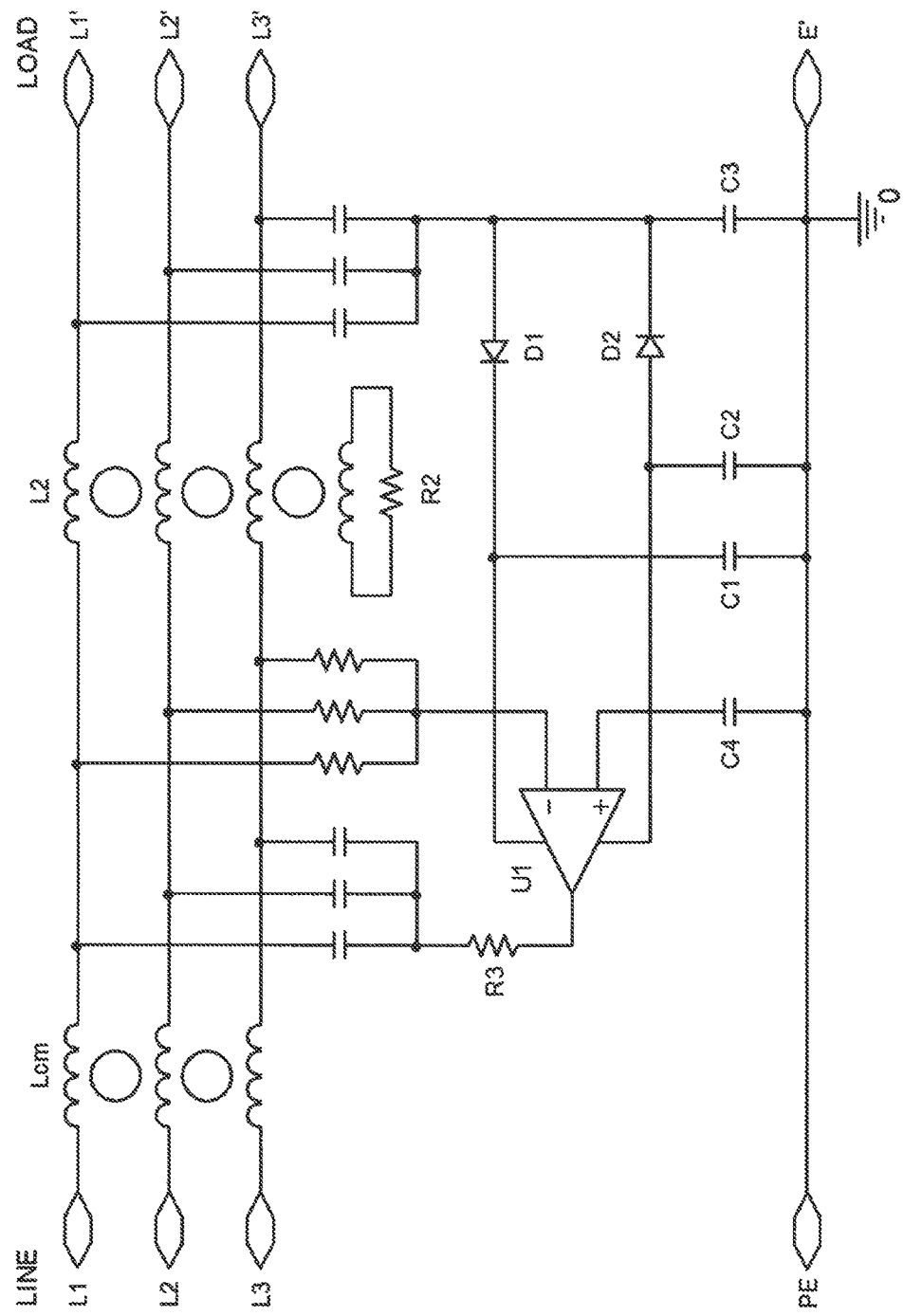
FIG. 7 shows an equivalent circuit of a three phase embodiment of the circuit in FIG. 6.

FIG. 7 shows a three phase embodiment of the embodiment shown in FIG. 6. The voltage buffer amplifier is replaced with a voltage amplifier U1 with differential inputs. The voltage amplifier output is connected to the three phase line via a resistance in series with a capacitor star network. The voltage amplifier is connected in a closed loop where the inverting input of the voltage amplifier is maintained at the common mode voltage of the line via a resistor star network. The voltage amplifier non-inverting input is maintained at the reference potential via capacitor C4. Thus the three phase line at the load-side of the common mode inductance Lcm is held near to the reference potential. Capacitors C1, C2 and C3 and diodes D1 and D2 are connected to the three phase load node via a capacitor star network. The discharge resistor R2 is inductively coupled to the bypass inductor L2 via and auxiliary winding on L2.

The circuit works in the same way as described for FIG. 6. The star point of the two additional capacitor networks and the additional resistor network serve as the common mode points of the three phase line. Voltage isolation integrity is provided by capacitors C1, C2, C3 and C4.

The voltage on the load-side of the common mode inductor Lcm is reduced near to the reference potential during most of the time and consequently the common mode current generated in the filter common mode inductor Lcm, which is proportional to the time integral of the voltage across the common mode inductor Lcm, is reduced considerably.

In the above-mentioned method, capacitors C1 and C2 serve as charge reservoirs that allow discharging capacitor C3. Capacitors C1 and C2 also serve as power supply reservoir capacitors feeding voltage amplifier U1. Capacitors C1 and C2 may be chosen to be larger than capacitor C3 wherein the capacitor C3 may be fully discharged while capacitors C1 and C2 may be only partially discharged. The output of the voltage buffer amplifier serves maintain near reference potential on the load-side of common mode inductor Lcm.

Figure 8:
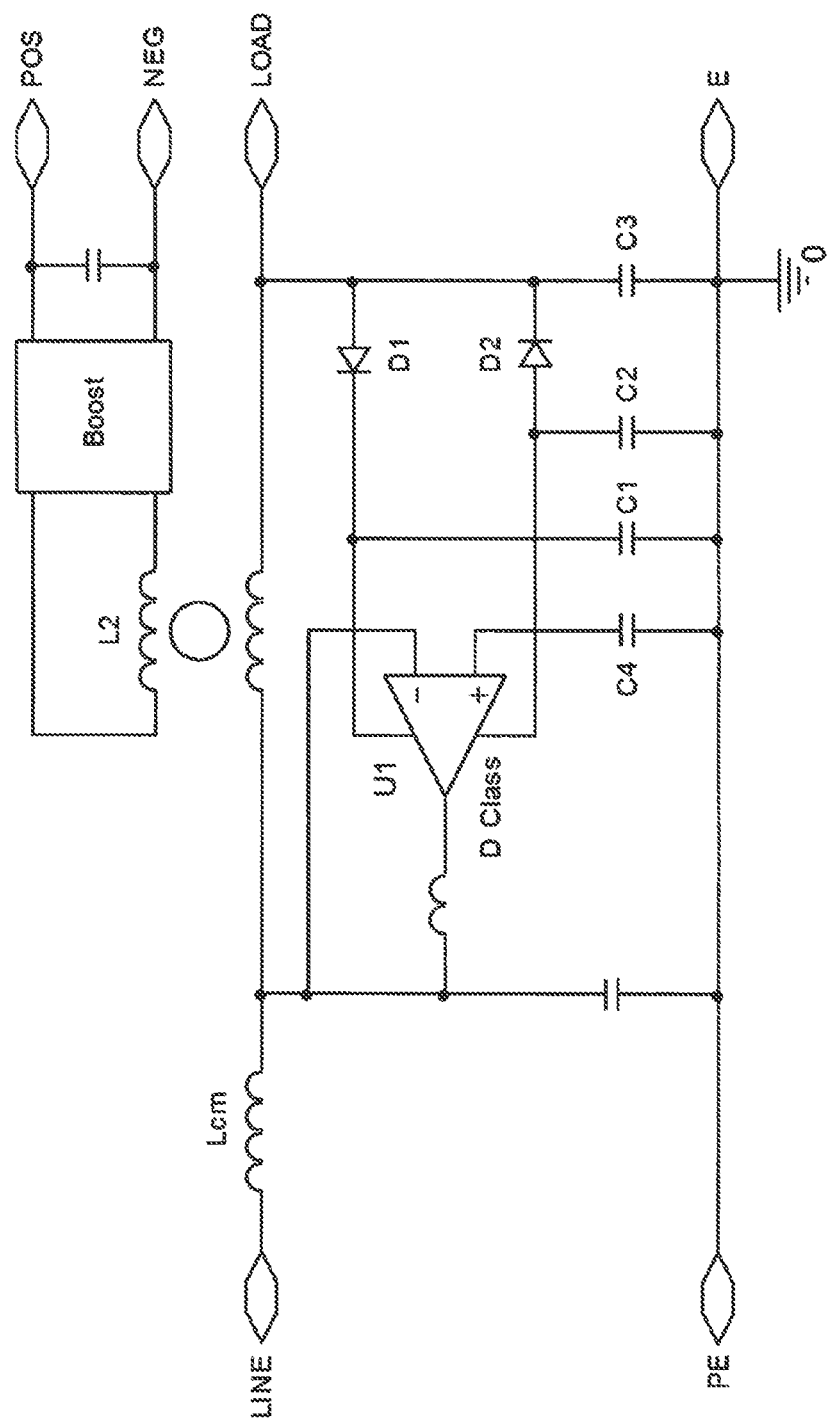
FIG. 8 shows a common mode equivalent circuit of the circuit in FIG. 6 with D class amplifier and voltage boost device to replace the discharge resistor.

FIG. 8 shows an embodiment of the invention where the efficiency of the embodiment shown in FIG. 6 is improved. The voltage buffer amplifier is replaced with a D class voltage amplifier U1 with differential inputs which is connected in closed loop whereby the load-side of common mode inductance Lcm is maintained near the reference potential by the error signal between non-inverting and inverting inputs. The function or capacitors C1, C2, C3 and C4 and diodes D1 and D2 remains the same. The discharge resistor is replaced by a voltage boost device which moves energy to a voltage supply within the motor drive system, i.e., the dc link, where the energy can be used efficiently. The input to the voltage boost may be made to be equivalent to the characteristics of the discharge resistor.

The circuit works in the same way as described for FIG. 6.

Voltage isolation integrity is provided by capacitors C1, C2, C3 and C4.

The voltage on the load-side of the common mode inductor Lcm is reduced near to the reference potential during most of the time and consequently the common mode current generated in the filter common mode inductor Lcm, which is proportional to the time integral of the voltage across the common mode inductor Lcm, is reduced considerably.

In the above-mentioned method, capacitors C1 and C2 serve as charge reservoirs that allow discharging capacitor C3. Capacitors C1 and C2 also serve as power supply reservoir capacitors feeding voltage amplifier U1. Capacitors C1 and C2 may be chosen to be larger than capacitor C3 wherein the capacitor C3 may be fully discharged while capacitors C1 and C2 may be only partially discharged. The output of the D class voltage amplifier serves to maintain near reference potential on the load-side of common mode inductor Lcm.

The invention claimed is:

1. An electronic device comprising:
   a first capacitor coupled in series to a first one-way conductor, the first one-way conductor allowing current flow in one direction, wherein the first one-way conductor and the first capacitor are coupled between a load node and a reference potential;
   a second capacitor coupled in series to a second one-way conductor, the second one-way conductor allowing current flow in an opposite direction, wherein the second one-way conductor and the second capacitor are coupled between the load node and the reference potential;
   a third capacitor being coupled between the load node and the reference potential;
   a first switch bypassing the first one-way conductor; and
   a second switch bypassing the second one-way conductor.

2. The electronic device according to claim 1,
   wherein the first switch is coupled between a potential node and the load node, wherein the potential node is arranged between the first one-way conductor and the first capacitor, and
   wherein the second switch is coupled between a further potential node and the load node, wherein the further potential node is arranged between the second one-way conductor and the second capacitor.

3. The electronic device according to claim 1, wherein the first switch connected in parallel with the first one-way conductor or the second switch connected in parallel with the second one-way conductor is embodied as a MOSFET with a body diode or an insulated-gate bipolar transistor with a freewheeling diode or a bipolar junction transistor with a freewheeling diode or a silicon-controlled rectifier with a reverse connected diode in parallel.

4. The electronic device according to claim 1, further comprising a switch control for switching the switches between a conducting state allowing current flow and a non-conducting state with no current flow.

5. An electronic device comprising:
   a first capacitor coupled in series to a first one-way conductor, wherein the first one-way conductor and the first capacitor are coupled between a load node and a reference potential;
   a second capacitor coupled in series to a second one-way conductor, wherein the second one-way conductor and the second capacitor are coupled between the load node and the reference potential;
   a third capacitor coupled in series to a third one-way conductor, wherein the third one-way conductor and the third capacitor is coupled between the load node and the reference potential;
   a fourth capacitor coupled in series to a fourth one-way conductor, wherein the fourth one-way conductor and the fourth capacitor are coupled between the load node and the reference potential, wherein the first and third one-way conductors allow current flow in one direction, and wherein the second and fourth one-way conductors allow current flow in the opposite direction,
   a first switch coupled between a first potential node and a second potential node, wherein the first potential node is arranged between the first capacitor and the first one-way conductor, and wherein the second potential node is arranged between the second capacitor and the second one-way conductor; and
   a second switch coupled between a third potential node and a fourth potential node, wherein the first potential node is arranged between the third capacitor and the third one-way conductor, and wherein the fourth potential node is arranged between the fourth capacitor and the fourth one-way conductor.

6. An electronic device comprising:
   a first capacitor coupled in series to a first one-way conductor, the first one-way conductor allowing current flow in one direction, wherein the first one-way conductor and the first capacitor are coupled between a load node and a reference potential;
   a second capacitor coupled in series to a second one-way conductor, the second one-way conductor allowing current flow in an opposite direction, wherein the second one-way conductor and the second capacitor are coupled between the load node and the reference potential;
   a third capacitor coupled between the load node and the reference potential; and
   an amplifier having an output terminal, and positive and negative supply rail terminals, the output terminal being coupled to the load node, the positive supply rail terminal being coupled to a first potential node, which is between the first capacitor and the first one-way conductor, and the negative supply rail terminal being coupled to a second potential node, which is between the second capacitor and the second one-way conductor.

7. The electronic device according to claim 6, wherein the amplifier is embodied as a voltage buffer amplifier, a linear voltage amplifier or a D class voltage amplifier.

8. The electronic device according to claim 6, wherein an input of the amplifier is coupled via a capacitor or a high-pass filter to the reference potential.

9. The electronic device according to claim 6, wherein a resistor and a inductor, which are coupled in parallel, are coupled between the output terminal of the amplifier and the load node, or wherein an inductor is coupled between the output terminal of the amplifier and the load node, and wherein a voltage boost device being coupled to the inductor via an auxiliary winding.

10. The electronic device according to claim 6, wherein the electronic device is connectable to a 3 phase supply, the device further comprising:
- a first star network of capacitors and a series resistor to couple the 3 phases to the output terminal of a linear voltage amplifier;
- a second star network of capacitors to couple the 3 phases to the one-way conductors and the third capacitor; and
- a star network of components to couple the 3 phases to an inverting input terminal of the amplifier.

11. A method for filtering a common mode disturbances by an electronic device, wherein the device comprises a first capacitor coupled in series to a first one-way conductor, the first capacitor and the first one-way conductor being coupled between a load node and a reference potential, a second capacitor coupled in series to a second one-way conductor, the second capacitor and the second one-way conductor being coupled between the load node and the reference potential, a third capacitor coupled between the load node and the reference potential, and a first switch coupled in parallel with the first one way conductor and a second switch coupled in parallel with the second one way conductor, the method comprising:
- applying alternating positive and negative voltage transitions at the load node;
- charging the first capacitor and the third capacitor positive by one positive voltage transition of the load node, wherein the first one-way conductor is in a conducting state thereby transferring energy to the first capacitor and the third capacitor;
- discharging the second capacitor and the third capacitor, the second capacitor having been charged negative by a previous negative voltage transition at the load node, when the second switch is switched to a conducting state;
- switching the second switch to a non-conducting state;
- charging the second capacitor and the third capacitor negative by one negative voltage transition of the load node, wherein the second one-way conductor is in a conducting state thereby transferring energy to the second capacitor and the third capacitor;
- discharging the first capacitor and third capacitor, the first capacitor having been charged positive by a previous positive voltage transition at the load node, when the first switch is switched to a conducting state; and
- switching the first switch to a non-conducting state.

12. The method according to claim 11, wherein the first switch in parallel with the first one-way conductor or the second switch in parallel with the second one-way conductor is embodied as a MOSFET with body diode or an insulated-gate bipolar transistor with freewheeling diode or a bipolar junction transistor with freewheeling diode or a silicon-controlled rectifier with a reverse connected diode in parallel.

13. A method for filtering common mode disturbances by an electronic device, wherein the device comprises a first capacitor coupled in series to a first one-way conductor, the first capacitor and the first one-way conductor being coupled between a load node and a reference potential, a second capacitor coupled in series to a second one-way conductor, the second capacitor and the second one-way conductor being coupled between the load node and the reference potential, a third capacitor coupled in series to a third one-way conductor, the third capacitor and the third one-way conductor being coupled between the load node and the reference potential, a fourth capacitor coupled in series to a fourth one-way conductor, the fourth capacitor and the fourth one-way conductor being coupled between the load node and the reference potential, a first switch coupled between a first potential node, which is between the first capacitor and the first one-way conductor, and a second potential node, which is between the second capacitor and the second one-way conductor, a second switch coupled between a third potential node, which is between the third capacitor and the third one-way conductor, and a fourth potential node, which is between the fourth capacitor and the fourth one-way conductor, the method comprising:
- applying alternating positive and negative voltage transitions at the load node;
- charging the first capacitor and the third capacitor positive by one positive voltage transition of the load node, wherein the first one-way conductor and the third one-way conductor are in a conducting state thereby transferring energy to the first capacitor and the third capacitor;
- discharging the first capacitor and the second capacitor, the second capacitor having been charged negative by a previous negative voltage transition at the load node, when the first switch is switched to a conducting state;
- switching the first switch to a non-conducting state;
- charging the second capacitor and the fourth capacitor negative by one negative voltage transition of the load node, wherein the second one-way conductor and the fourth one-way conductor are in a conducting state thereby transferring energy to the second capacitor and the fourth capacitor;
- discharging the third capacitor and the fourth capacitor, the third capacitor having been charged positive by a previous positive voltage transition at the load node, when the second switch is switched to a conducting state; and
- switching the second switch to a non-conducting state.

14. A method for filtering common mode disturbances by an electronic device, wherein the device comprises a first capacitor coupled in series to a first one-way conductor, wherein the first capacitor and the first one-way conductor are coupled between a load node and a reference potential, a second capacitor coupled in series to a second one-way conductor, wherein the second capacitor and the second one-way conductor are coupled between the load node and the reference potential, a third capacitor coupled between the load node and the reference potential, and an amplifier having an output terminal, and positive and negative supply rail terminals, the output terminal being coupled to the load node, the positive supply rail terminal being coupled to the first capacitor and the negative supply rail terminal being coupled to the second capacitor, the method comprising:
- applying positive and negative voltage transitions at the load node;
- charging the first capacitor positive by positive voltage transitions of the load node, wherein the first one-way conductor is in a conducting state thereby transferring energy to the first capacitor;
- charging the second capacitor negative by negative voltage transitions of the load node, wherein the second one-way conductor is in a conducting state thereby transferring energy to the second capacitor;
- charging the third capacitor positive when a positive transition is applied and negative when a negative transition is applied;

discharging the third capacitor to a voltage near to reference potential into the output terminal of the amplifier;

at least partially discharging the first capacitor via the positive supply rail terminal of the amplifier; and at least partially discharging the second capacitor via the negative supply rail terminal of the amplifier.

15. The method according to claim 14, wherein the amplifier is embodied as a linear voltage amplifier being connected in closed loop, as a voltage buffer amplifier or as D Class voltage amplifier.

16. The method according to claim 14, wherein a first inductor is coupled in series to a second inductor, the first inductor and the second inductor coupled between a line node and the load node with the first inductor on a line-side and the second inductor on a load-side, wherein a resistor is coupled in parallel with the second inductor, and wherein the third capacitor is discharged via the resistor.

17. The method according to claim 14, wherein a first inductor is coupled in series to a second inductor, the first inductor and the second inductor being coupled between a line node and the load node with the first inductor on a line-side and the second inductor on a load-side, wherein an input to a voltage boost device is coupled to the second inductor via an auxiliary winding, wherein the third capacitor is discharged via the second inductor, wherein the energy stored in the third capacitor is transferred from the auxiliary winding into the input of the voltage boost device, wherein the output of the voltage boost device is coupled to an external power sink, and wherein the energy removed from the third capacitor is deposited.

18. The method according to claim 14, wherein an input of the amplifier is coupled via a capacitor or a high-pass filter to the reference potential.

19. The method according to claim 14, wherein a first star network of capacitors and a series resistor are coupled between a line side of a 3 phase supply and the output terminal of the amplifier, wherein a second star network of capacitors is coupled between a load side of the 3 phase supply and the one-way conductors and the third capacitor, and wherein a star network of impedance components is coupled between the 3 phases of the 3 phase supply and an inverting input terminal of the amplifier.

* * * * *